United States Patent
Yang

(10) Patent No.: US 8,324,047 B1
(45) Date of Patent: Dec. 4, 2012

(54) METHOD AND STRUCTURE OF AN INTEGRATED CMOS AND MEMS DEVICE USING AIR DIELECTRIC

(75) Inventor: Xiao "Charles" Yang, Cupertino, CA (US)

(73) Assignee: MCube Inc., San Jose, CA (US)

( * ) Notice: Subject to any disclaimer, the term of this patent is extended or adjusted under 35 U.S.C. 154(b) by 209 days.

(21) Appl. No.: 12/945,846

(22) Filed: Nov. 13, 2010

Related U.S. Application Data

(60) Provisional application No. 61/260,848, filed on Nov. 13, 2009.

(51) Int. Cl.
*H01L 21/8242* (2006.01)

(52) U.S. Cl. ........ 438/240; 438/149; 438/166; 438/222; 438/258; 438/450; 257/52; 257/59; 257/86; 257/350; 257/E21.002

(58) Field of Classification Search .................. None
See application file for complete search history.

(56) References Cited

U.S. PATENT DOCUMENTS

| | | | |
|---|---|---|---|
| 5,668,033 A * | 9/1997 | Ohara et al. ................. | 438/113 |
| 2002/0072163 A1 | 6/2002 | Wong et al. | |
| 2006/0205106 A1 | 9/2006 | Fukuda et al. | |
| 2008/0283991 A1 | 11/2008 | Reinert | |
| 2010/0075481 A1 | 3/2010 | Yang | |
| 2010/0109102 A1 | 5/2010 | Chen et al. | |

OTHER PUBLICATIONS

Non-Final Office Action for U.S. Appl. No. 12/634,663, mailed on Oct. 13, 2011, 9 pages.
Notice of Allowance for U.S. Appl. No. 12/717,070, mailed on Mar. 9, 2012, 9 pages.
Notice of Allowance for U.S. Appl. No. 12/634,663, mailed on Mar. 21, 2012, 8 pages.

* cited by examiner

*Primary Examiner* — Kyoung Lee
(74) *Attorney, Agent, or Firm* — Kilpatrick Townsend & Stockton LLP

(57) ABSTRACT

In a specific embodiment, the present invention provides an integrated circuit device. The device includes a base substrate having a surface region and an interlayer dielectric material overlying the surface region. The device also has a thickness of single crystal silicon material overlying the interlayer dielectric material. In one or more embodiments, the thickness of single crystal silicon material has a front region and a backside region. The front region faces the interlayer dielectric material. In a preferred embodiment, the device has a plurality of transistor devices spatially arranged in the thickness of silicon crystal silicon material. Each of the transistor devices has a gate structure within a region of the interlayer dielectric material. The device also has an enclosure housing configured to form a cavity between the backside region of the thickness of silicon material and an upper inside region of the enclosure housing.

20 Claims, 2 Drawing Sheets

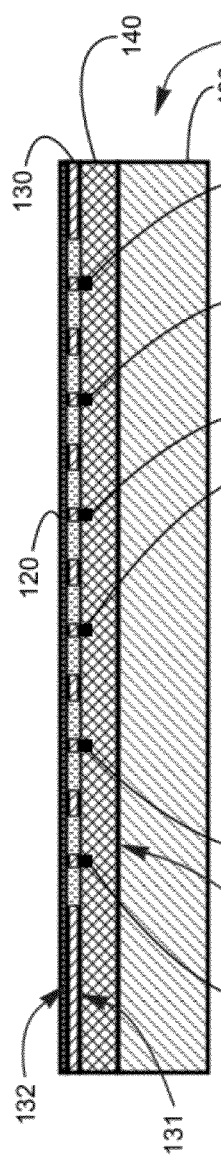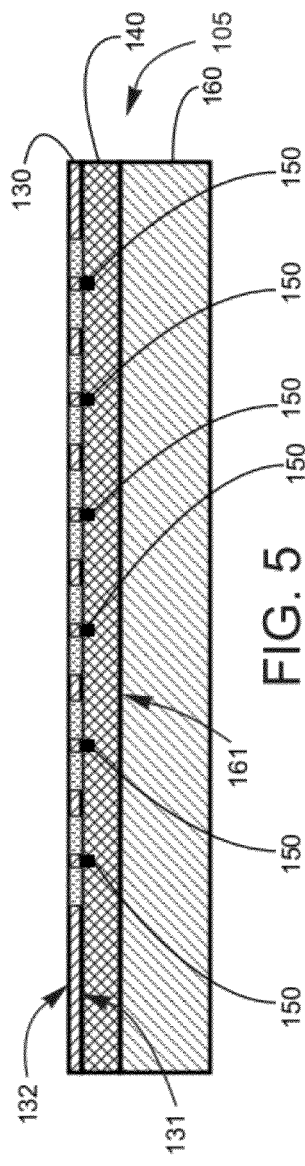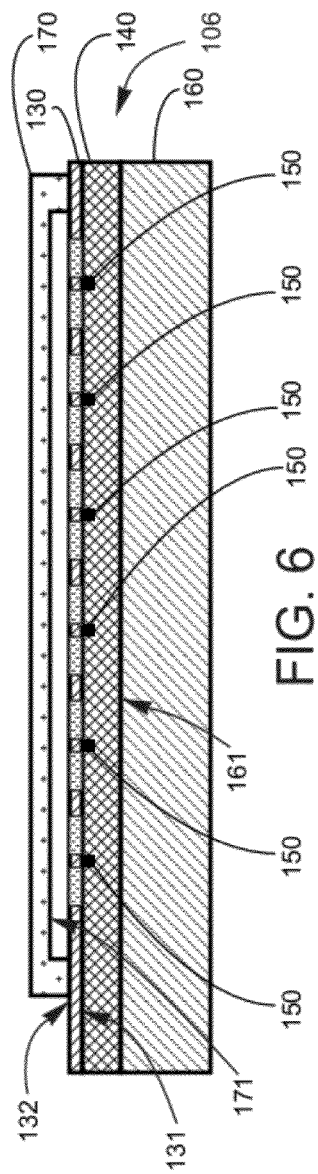

METHOD AND STRUCTURE OF AN INTEGRATED CMOS AND MEMS DEVICE USING AIR DIELECTRIC

CROSS-REFERENCES TO RELATED APPLICATIONS

The present application claims priority to and incorporates by reference, for all purposes, the following pending patent application: U.S. patent application Ser. No. 61/260,848, filed Nov. 13, 2009. The present invention also incorporates by reference, for all purposes, the following co-pending patent applications related to CMOS & MEMS devices and IC fabrication methodology: U.S. patent application Ser. No. 12/634,663, filed Dec. 9, 2009, U.S. patent application Ser. No. 12/490,067, filed Jun. 23, 2009, U.S. patent application Ser. No. 12/717,070, filed Mar. 3, 2010, U.S. patent application Ser. No. 12/859,631, filed Aug. 19, 2010, U.S. patent application Ser. No. 61/356,467, filed Jun. 18, 2010, U.S. patent application Ser. No. 12/859,672, filed Aug. 19, 2010, and U.S. patent application Ser. No. 12/859,647, filed Aug. 19, 2010.

BACKGROUND OF THE INVENTION

The present invention relates generally to integrated devices. More particularly, the present invention provides an integrated circuit free from bulk semiconductor material configured on at least CMOS integrated circuit devices as well as a method for fabricating the integrated circuit configured on at least CMOS IC devices. But it will be recognized that the invention has a much broader range of applicability.

Electronic technology has experienced explosive growth in the past years. Such technology can be found in commonly used products such as the Blackberry™ phone by Research in Motion Limited, Laptop or Netbook computers, to gaming consoles including the Nintendo Wii™, among others. Electronic technology can also be found in our Internet and telephone networks, security, financial applications, and healthcare and medical systems and devices. An essential component to the explosive growth and evolution of electronic technology has been semiconductor technology, and most particularly semiconductor integrated circuits.

Semiconductor integrated circuits have evolved from a handful of interconnected devices fabricated on a single chip of silicon to millions and even billions of individual devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation integrated circuits. Semiconductor devices are now being fabricated with features less than one tenth of a micron across.

Similar to integrated circuits, Micro-Electro-Mechanical Systems, commonly called MEMS, has also evolved into many common applications. Examples of MEMS include sensors, actuators, and micromachines. Conventional MEMS are often fabricated using micromachining processes that selectively etch away parts of the silicon wafer or add new structural layers to form the mechanical and electromechanical devices. MEMS can be found in applications such as automotive, gaming, sports, and others. Although highly successful, MEMS still have limitations. That is, like semiconductor integrated circuits, making makes smaller and less expensive has been challenging. Additionally, integration between MEMS and integrated circuits has been difficult due to incompatible processing capabilities. These and other limitations of conventional electronic technology have been described more particularly throughout the present specification and more particularly below.

From the above, it is seen that an improved techniques for manufacturing electronic technologies are highly desired.

BRIEF SUMMARY OF THE INVENTION

According to the present invention, techniques related generally to integrated devices and systems are provided. More particularly, the present invention provides an integrated circuit free from bulk semiconductor material configured on at least CMOS integrated circuit devices. But it will be recognized that the invention has a much broader range of applicability.

In a specific embodiment, the present invention provides an integrated circuit device. The device can include a base substrate having a surface region and an interlayer dielectric material overlying the surface region. The device can also have a thickness of single crystal silicon material overlying the interlayer dielectric material. In one or more embodiments, the thickness of single crystal silicon material can have a front region and a backside region. Also, the front region can be the region that faces the interlayer dielectric material. In a preferred embodiment, the device can have a plurality of transistor devices spatially arranged in the thickness of silicon crystal silicon material. Each of the transistor devices can have a gate structure within a region of the interlayer dielectric material. The device also can have an enclosure housing configured to form a cavity between the backside region of the thickness of silicon material and an upper inside region of the enclosure housing. Those of ordinary skill in the art will recognize other variations, modification, and alternatives.

In a specific embodiment, the present invention provides a method for fabricating an integrated circuit device. The method includes providing a base substrate having a surface region and forming an interlayer dielectric material overlying the surface region. The device can also have a thickness of single crystal silicon material formed overlying the interlayer dielectric material. In one or more embodiments, the thickness of single crystal silicon material has a front region and a backside region, with the front region facing the interlayer dielectric material. Also, a plurality of transistor devices can be formed and spatially arranged in the thickness of silicon crystal silicon material. Each of the transistor devices can have a gate structure within a region of the interlayer dielectric material. An enclosure housing can be then formed overlying the transistor devices and configured to form a cavity between the backside region of the thickness of silicon material and an upper inside region of the enclosure housing. Of course, there can be other variations, modifications, and alternatives.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved.

These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

The diagrams disclosed in the present patent application are merely implementation examples, which should not unduly limit the scope of the claims herein. It should be understood that the examples and embodiments described herein are for illustrative purposes only and that various modifications or changes in light thereof will be suggested to persons skilled in the art and are to be included within the spirit and purview of this process and scope of the appended claims.

FIGS. 1-6 are simplified diagrams illustrating an integrated circuit device according to various embodiments of the present invention.

DETAILED DESCRIPTION OF THE INVENTION

Figure 1:
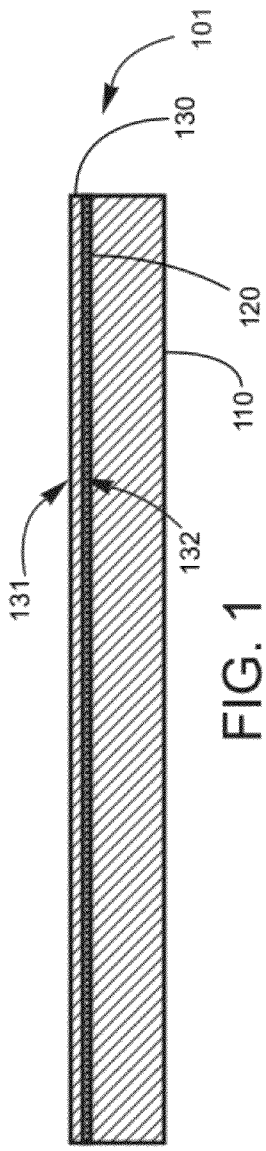

According to the present invention, techniques related generally to integrated devices and systems are provided. More particularly, the present invention provides an integrated circuit free from bulk semiconductor material configured on at least CMOS integrated circuit devices. But it will be recognized that the invention has a much broader range of applicability.

FIGS. 1-6 are simplified diagrams illustrating an integrated circuit device according to various embodiments of the present invention.

In a specific embodiment, the present invention provides a method for forming an integrated circuit device. As shown, device 101 of FIG. 1 can represent an initial phase of a method embodiment. The method can include providing a bulk substrate 110 and forming a dielectric material 120 overlying the bulk substrate 110. Also, a thickness of single crystal silicon material 130 can be formed overlying the dielectric material 120. In one or more embodiments, the thickness of single crystal silicon material 130 can have a front region 131 and a backside region 132. In a specific embodiment, the thickness of single crystal silicon material can have a thickness of 100 micrometers and less. In various embodiments, the backside of the single crystal silicon material can be thinned. The front region 131 can face the dielectric material 120.

Figure 2:
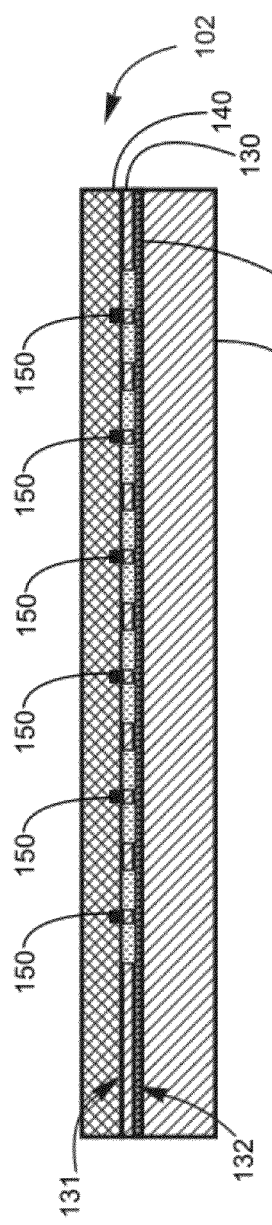

As shown in FIG. 2, device 102 can represent a step in IC fabrication following the initial phase shown in FIG. 1. In a specific embodiment, the method includes forming an interlayer dielectric material 140 overlying the thickness of single crystal silicon 130. In a specific embodiment, the interlayer dielectric material can include two or more materials. Also, a plurality of transistor devices 150 can be formed and spatially arranged in the thickness of silicon crystal silicon material 130. Each of the transistor devices 150 can have a gate structure formed within a region of the interlayer dielectric material 140. Also, each of the transistor devices 150 can be provided within a well region formed within a portion of the thickness of single crystal silicon material 130. In a specific embodiment, the plurality of transistor devices 150 can be CMOS transistor devices.

Figure 3:
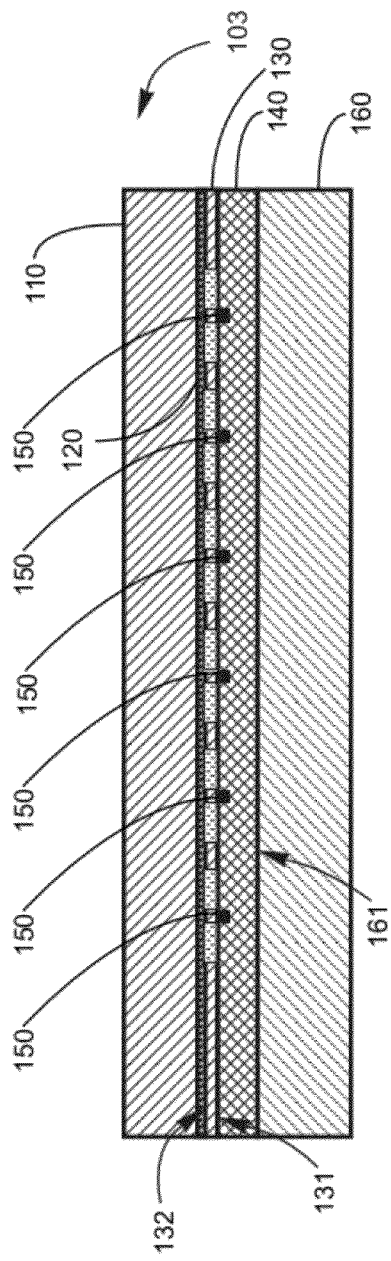

FIG. 3 can represent another method step during which the exposed interlayer dielectric material side of device 102 (FIG. 2) can be rotated and bonded with a base substrate 160. The base substrate 160 can include semiconductor materials, conductor materials, or insulating materials. This figure can represent the device 103 being prepared for the removal of the bulk substrate 110. FIG. 4 can represent a method step wherein the device 104 can have the bulk substrate 110 removed via an etching process, a mechanical process, or a like process. The dielectric material 120, which is exposed during this step, can also be etched away, as shown in FIG. 5. In this figure, device 105 depicts the backside 132 of the thickness of silicon material 130 being exposed after the removal of the dielectric material 120.

Following the removal of the bulk substrate 110 and the dielectric material 120, an enclosure housing 170 can be formed overlying the plurality of transistor devices 150, as shown in FIG. 6. In a specific embodiment, an enclosure housing 170 can be configured to form a cavity between the backside region 132 of the thickness of silicon material 130 and an upper inside region 171 of the enclosure housing. In a specific embodiment, the enclosure housing can be made of a semiconductor, a conductor, or a dielectric. Furthermore, the cavity between backside region 132 and the inside region 171 can include an inert gas or a dielectric material, which can have a dielectric constant of about 1 and slightly greater. Those skilled in the art will recognize other variations, modifications, and alternatives.

FIG. 6 also depicts an embodiment of a fully fabricated integrated circuit device. Device 106 is configured such that the base substrate 160 has the interlayer dielectric material 140 overlying the surface region 161 of the base substrate 160. The device 100 also has the thickness of single crystal silicon material 130 overlying the interlayer dielectric material 140. The front region 131 of the silicon material 130 faces the interlayer dielectric material 140, while the backside region 132 faces away from the dielectric material 140.

In a preferred embodiment, the device has a plurality of transistor devices 150 spatially arranged in the thickness of silicon crystal silicon material 130. Each of the transistor devices 150 has a gate structure within a region of the interlayer dielectric material 140. The device also has an enclosure housing 170 configured to form a cavity between the backside region 132 of the thickness of silicon material 130 and an upper inside region 171 of the enclosure housing 170. Those skilled in the art will recognize other variations, modifications, and alternatives.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device comprising:
   a base substrate having a surface region;
   an interlayer dielectric material overlying the surface region;

a thickness of single crystal silicon material overlying the interlayer dielectric material, the thickness of single crystal silicon material having a font region and a backside region, the front region facing the interlayer dielectric material;

a plurality of transistor devices spatially arranged in the thickness of silicon crystal silicon material, each of the transistor devices having a gate structure within a region of the interlayer dielectric material; and an enclosure housing configured to form a cavity between the backside region of the thickness of silicon material and an upper inside region of the enclosure housing.

2. The device of claim 1 wherein the base substrate is made of a semiconductor material, a conductor material, or an insulating material.

3. The device of claim 1 wherein the thickness of single crystal silicon material is 100 micrometers or less.

4. The device of claim 1 wherein the backside of the silicon crystal silicon material is thinned.

5. The device of claim 1 wherein the interlayer dielectric material comprises two or more materials.

6. The device of claim 1 wherein each of the transistor devices is located within a well region formed within a portion of the thickness of single crystal silicon material.

7. The device of claim 1 wherein each of the transistor device comprises an MOS device.

8. The device of claim 1 wherein the enclosure housing is made of a semiconductor, a conductor, or a dielectric.

9. The device of claim 1 further comprising an inert gas within the cavity.

10. The device of claim 1 further comprising a dielectric material within the cavity.

11. The device of claim 1 wherein the cavity is characterized by a dielectric constant of about 1 or slightly greater.

12. A method for fabricating an integrated circuit device, the method comprising:
providing a bulk substrate;
forming a dielectric material overlying the bulk substrate;
forming a thickness of single crystal silicon material overlying the dielectric material, the thickness of single crystal silicon material having a front region and a backside region;
forming an interlayer dielectric material overlying the thickness of single crystal silicon material;
forming a plurality of transistor devices spatially arranged in the thickness of silicon crystal silicon material, each of the transistor devices having a gate structure within a region of the interlayer dielectric material;
bonding the interlayer dielectric material to a base substrate, the base substrate having a surface region, the interlayer dielectric material being bonded to the surface region;
removing the bulk substrate;
removing the dielectric material; and
forming an enclosure housing configured to form a cavity between the backside region of the thickness of silicon material and an upper inside region of the enclosure housing.

13. The method of claim 12 wherein the base substrate is made of a semiconductor material, a conductor material, or an insulating material.

14. The method of claim 12 wherein the thickness of single crystal silicon material is 100 micrometers and less.

15. The method of claim 12 wherein the backside of the silicon crystal silicon material is thinned.

16. The device of claim 12 wherein the interlayer dielectric material comprises two or more materials.

17. The device of claim 12 wherein each of the transistor devices is provided within a well region formed within a portion of the thickness of single crystal silicon material.

18. The device of claim 12 wherein each of the transistor devices comprises an MOS device.

19. The device of claim 12 wherein the enclosure housing is made of a semiconductor, a conductor, or a dielectric.

20. The device of claim 12 wherein the cavity comprises an inert gas.

* * * * *